United States Patent [19]
Kasori et al.

[11] Patent Number: 5,126,293
[45] Date of Patent: Jun. 30, 1992

[54] LIGHT-SHIELDING A DELTA N SINTERED BODY AND METHOD OF MANUFACTURING THE SAME

[75] Inventors: Mitsuo Kasori; Akihiro Horiguchi, both of Kawasaki; Fumio Ueno, Yokohama; Yoshiko Goto, Tokyo; Naoki Shutoh, Yokohama, all of Japan

[73] Assignee: Kabushiki Kaisha Koshiba, Kawasaki, Japan

[21] Appl. No.: 625,989

[22] Filed: Nov. 29, 1990

[30] Foreign Application Priority Data

Nov. 30, 1989 [JP] Japan .................. 1-309131

[51] Int. Cl.⁵ .................. C04B 35/58
[52] U.S. Cl. .................. 501/96; 501/98
[58] Field of Search .................. 501/96, 98

[56] References Cited

U.S. PATENT DOCUMENTS

| | | | |
|---|---|---|---|
| 4,659,611 | 4/1987 | Iwase et al. .................. | 428/209 |
| 4,833,108 | 5/1989 | Mizuno et al. .................. | 501/98 |
| 4,847,221 | 7/1989 | Horiguchi et al. .................. | 501/98 |
| 4,877,760 | 10/1989 | Okuno et al. . | |
| 4,883,780 | 11/1989 | Kasori et al. .................. | 501/96 |

FOREIGN PATENT DOCUMENTS 0207465 1/1987 European Pat. Off. .
0342595 11/1989 European Pat. Off. .

OTHER PUBLICATIONS

Journal of Materials Science Letters 3 (1984) 471-474 N. Kuramoto et al., "Transparent AlN Ceramics".
Development of High-Thermal Conductivity Aluminum Nitride Ceramics A. Horiguchi et al., Toshiba Review 44 Z[8] 1989, 616-618.
Nonmetallic Crystals with High Thermal Conductivity, G. A. Slack J. Phys. Chem. Solids, 1973, vol. 34, pp. 321-335.

Primary Examiner—William R. Dixon, Jr.
Assistant Examiner—Chris Gallo
Attorney, Agent, or Firm—Oblon, Spivak, McClelland, Maier & Neustadt

[57] ABSTRACT

A light-shielding aluminum nitride sintered body essentially consists of aluminum nitride crystal grains and 0.01 to 1.5 wt % (an element content in the case of a transition metal compound) of homogeneously dispersed transition metal particles and/or transition metal compound particles having an average particle size of 5 μm or less and has a thermal conductivity of 200 W/m.K or more.

10 Claims, 4 Drawing Sheets

LIGHT-SHIELDING A DELTA N SINTERED BODY AND METHOD OF MANUFACTURING THE SAME

BACKGROUND OF THE INVENTION

1. Field of the Invention

The present invention relates to a light-shielding aluminum nitride sintered body and a method of manufacturing the same and, more particularly, to a light-shielding aluminum nitride sintered body suitably used as a substrate of a circuit board and a method of manufacturing the same.

2. Description of the Related Art

An aluminum nitride (AlN) sintered body has a thermal conductivity much higher than that of alumina, a good insulation property, and a thermal expansion coefficient close to that of silicon (Si). Therefore, it is attempted to apply an AlN sintered body to a substrate of a circuit board for mounting a semiconductor device.

U.S. Pat. No. 4,847,221 discloses an AlN sintered body consisting of an A%N single phase and a second phase containing 0.01 to 8,000 ppm of a rare earth element and 2,000 ppm or less of oxygen and having a thermal conductivity of 200 W/m·K or more. Since such an AlN sintered body has a high thermal conductivity, an undesirable phenomenon which has not been encountered in conventional sintered bodies is caused. That is, a high thermal conductivity of the above AlN sintered body is achieved by a high purity of the sintered body. An AlN sintered body having a high purity, however, inevitably exhibits transparency as its essential property. The transparency is an undesirable characteristic depending on the field of applications. For example, when the above AlN sintered body is used as a substrate of a circuit board, a semiconductor chip such as an IC chip or an LSI chip mounted on the upper surface of the circuit board may be irradiated with light transmitted through the lower surface of the circuit board to cause an erroneous operation by a photoelectric effect. In addition, since a slight color tone difference is conspicuous in a substrate consisting of a transparent AlN sintered body, its outer appearance is degraded.

In order to solve the above problems, U.S. Pat. No. 4,883,780 discloses an AlN sintered body which is colored dark gray, black, or the like. This AlN sintered body consists of (a) AlN, (b) at least one member selected from the group consisting of a rare earth aluminum compound, an alkali earth compound, and a rare earth alkali earth aluminum compound, and (c) at least one member selected from the group consisting of Hf, Mo, W, and transition metals belonging to the groups Va, VIIa, and VIII of the periodic table. The AlN sintered body contains 0.01 to 18 wt % (oxide content) of the component (b) and 0.01 to 15 wt % of the component (c). Since, however, at least one of a rare earth aluminum compound, an alkali earth compound, and a rare earth alkali earth aluminum compound as the component (b) is present in an AlN grain boundary or the like of such an AlN sintered body, the thermal conductivity of this AlN sintered body is unsatisfactory, i.e., a maximum of at most about 110 W/m·K.

As described above, it is difficult to obtain an AlN sintered body having both a high thermal conductivity and a satisfactory light-shielding property by the conventional techniques.

SUMMARY OF THE INVENTION

It is an object of the present invention to provide an AlN sintered body having a high thermal conductivity and a good light-shielding property.

It is another object of the present invention to provide a method of manufacturing the above AlN sintered body having both a high thermal conductivity and a satisfactory light-shielding property by simple manufacturing steps.

According to the present invention, there is provided a light-shielding aluminum nitride sintered body essentially consisting of A%N crystal grains and 0.1 to 1.5 wt % (an element content in the case of a transition metal compound) of homogeneously dispersed transition metal particles and/or transition metal compound particles.

In addition, according to the present invention, there is provided a method of manufacturing a light-shielding aluminum nitride sintered body, comprising the steps of:

molding a raw material powder consisting of 30 wt % or less (an element content) of an alkali earth compound powder and/or rare earth compound powder and 0.01 to 1.5 wt % (an element content in the case of a transition metal compound of transition metal particles and/or transition metal compound particles, the balance of the material powder consisting of an aluminum nitride powder; and sintering the molded body in a reduction gas atmosphere at 1,800° C. to 2,000° C.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

Figure 1:
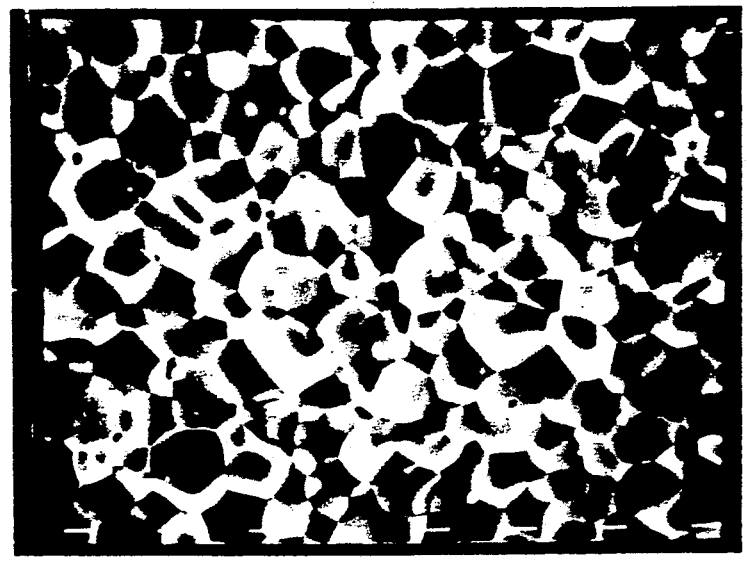
FIGS. 1 to 4 are SEM photographs showing sections of AlN sintered bodies manufactured by Example 1 and Comparative Examples 1 to 3, respectively.
Figure 2:
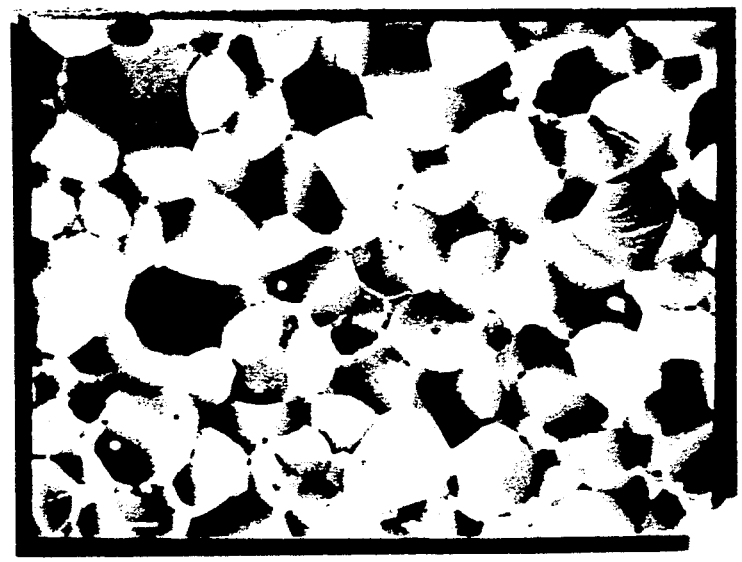
Figure 3:
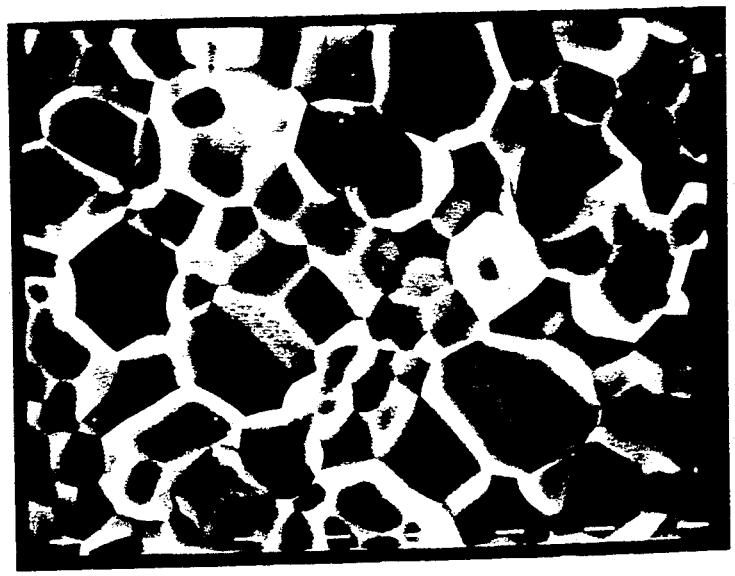
Figure 4:
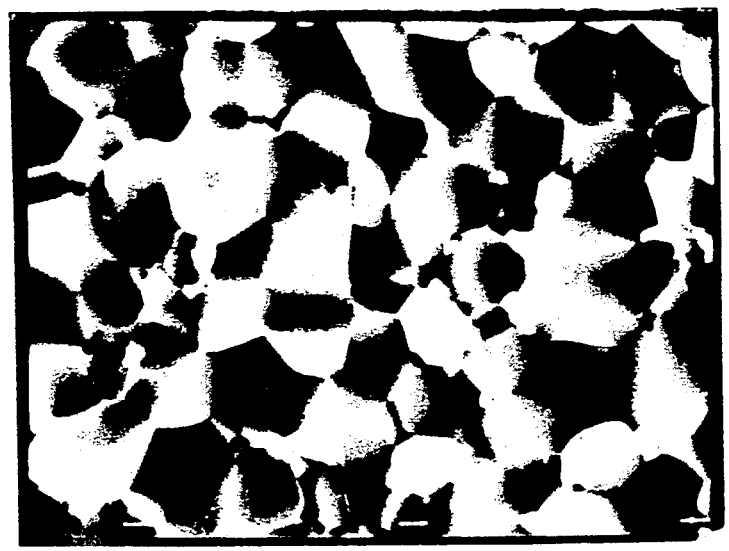

A light-shielding AlN sintered body according to the present invention essentially consists of aluminum nitride crystal grains and 0.01 to 1.5 wt % (an element content in the case of a transition metal compound) of homogeneously dispersed transition metal particles and/or transition metal compound particles.

Examples of the transition metal are Zr, Nb, Ta, Ti, W, Mo, Cr, Fe, Co, and Ni. Although a nitride, a carbide, an oxide, an oxycarbide, and an oxynitride of various types of transition metals can be exemplified as the compound, the compound most preferably has electrical conductivity. Examples of a transition metal compound having electrical conductivity are a nitride and a carbide of a metal selected from the group consisting of Zr, Nb, Ta, and Ti.

The transition metal particles or the transition metal compound particles preferably have an average particle size of 5 μm or less because a coloring effect may become unsatisfactory if the average particle size of the transition metal particles of the transition metal compound particles is more than 5 μm.

A dispersion amount of the transition metal particles and/or transition metal compound particles is limited for the following reason. That is, if the dispersion amount of the transition metal particles and/or transition metal compound particles is less than 0.01 wt %, an AlN sintered body having a light-shielding property cannot be obtained. If the dispersion amount of the transition metal particles and/or transition metal compound particles is more than 1.5 wt %, an amount of the transition metal particles and/or transition metal compound particles dispersed in a grain boundary or the like of the AlN crystal grains becomes too large to obtain an AlN sintered body having a high thermal conductivity and degraded electrical characteristics. The dispersion amount of the transition metal particles and/or transition metal compound particles is more preferably 0.2 to 1 wt %.

Note that the AlN sintered body according to the present invention is allowed to contain 8,000 ppm or less, and preferably, 3,000 ppm or less of cation impurities of an alkali earth element and/or rare earth element and 2,000 ppm or less of impurity oxygen as components other than the AlN crystal grains and the transition metal particles and/or transition metal compound particles.

Another light-shielding AlN sintered body according to the present invention essentially consists of aluminum nitride crystal grains and homogeneously dispersed transition metal particles and/or transition metal compound particles and has a thermal conductivity of 200 W/m·K or more.

A method of manufacturing a light-shielding aluminum nitride sintered body according to the present invention comprises the steps of:

molding a raw material powder consisting of 30 wt % or less (an element content) of an alkali earth compound powder and/or rare earth compound powder and 0.01 to 1.5 wt % (an element content in the case of a transition metal compound) of transition meta particles and/or transition metal compound particles, the balance of the material powder consisting of an aluminum nitride powder; and sintering the molded body in a reduction gas atmosphere at 1,800° C. to 2,000° C.

The AlN powder contains preferably 0.1 to 2.5 wt %, and more preferably, 0.3 to 2.0 wt % of impurity oxygen and has an average particles size of preferably 1.5 μm or less, and more preferably, 0.1 to 1.2 μm. The impurity oxygen amount and the average particle diameter are limited for the following reasons. That is, if the impurity oxygen amount is less than 0.1 wt %, it is difficult to manufacture an AlN sintered body having both a high density and a high purity. If the impurity oxygen amount exceeds 2.5 wt %, it is difficult to manufacture an AlN sintered body having a high thermal conductivity. In addition, if the average particle size of the AlN AlN powder is degraded to make it difficult to manufacture an AlN sintered body having both a high density and a high purity.

The alkali earth compound and/or rare earth compound are converted into a composite oxide such as alkali earth aluminate, rare earth aluminate, or alkali earth/rare earth aluminate upon sintering and are removed from the system of the sintered body when sintering is finished. Examples of such an alkali earth compound are an oxide, a carbide, a fluoride, a carbonate, an oxalate, a nitrate, and an alkoxide of Ca, Ba, and Sr. Examples of the rare earth compound are an oxide, a carbide, a fluoride, a carbonate, an oxalate, a nitrate, and an alkoxide of Y, La, Ce, Nd, Dy, and Pr. Most preferable examples are compounds of Y, La, and Ce.

An addition amount of the alkali earth compound powder and/or rare earth compound powder is limited for the following reason. That is, if the amount of the compound powders is more than 30 wt %, elements of the compounds remain in an AlN grain boundary to degrade the high thermal conductivity of the AlN sintered body. The amount of the compound powders is more preferably 0.1 to 20 wt %.

Examples of the transition metal compound are an oxide, a carbide, a fluoride, a carbonate, an oxalate, a nitrate, and an alkoxide of a transition metal.

The amount of the transition metal particles and/or transition metal compound particles is limited for the following reasons. If the amount of the particles is less than 0.01 wt %, an AlN sintered body having a light-shielding property cannot be obtained. If the amount is more than 1.5 wt %, not only an AlN sintered body having a high thermal conductivity cannot be obtained, but also a sintering property of an AlN sintered body is degraded. A more preferable amount of the transition metal particles and/or transition metal compound particles is 0.01 to 0.99 wt %.

An example of the reduction gas is a gas mixture of carbon gas and an inert gas such as $N_2$, Ar, or He. The carbon gas may be supplied from a carbon heater or a carbon vessel of a sintering furnace or from a thermal decomposition gas of hydrocarbon gas such as methane supplied together with the inert gas.

The sintering temperature is limited for the following reasons. That is, if the sintering temperature is less than 1,800° C., not only a sintering property of a molded body is degraded, but also the elements of the alkali earth compound powder and/or rare earth compound powder as a sintering assistant are not removed but remain in an AlN grain boundary to decrease the thermal conductivity of the manufactured AlN sintered body. If the sintering temperature is more than 2,000° C., AlN in the molded body is sublimated to react with carbon gas in the atmosphere, thereby producing a large amount of a carbide and nitride to decrease the thermal conductivity of the manufactured AlN sintered body. In addition, sintering is preferably performed for six hours or more if the sintering temperature is at the lower limit (1,800° C.) of the above sintering temperature range and for 4 hours or more if it is at the upper limit (2,000° C.).

Since the AlN sintered body according to the present invention described above essentially consists of AlN crystal grains and 0.01 to 1.5 wt % (an element content in the case of a transition metal compound) of homogeneously dispersed transition metal particles and/or transition metal compound particles, it has both a high thermal conductivity and a good light-shielding property.

That is, it is assumed that when a molded body consisting of an AlN powder and an additive is sintered at a predetermined temperature, an aluminum oxide impurity inevitably contained in the AlN powder reacts with the additive to produce an aluminate and causes a liquid phase reaction to increase the density of an AlN sintered body. For example, if $Y_2O_3$ is used as an additive, a Y-Al-O-based composite oxide such as $3Y_2O_3 \cdot 5Al_2O_3$, $Y_2O_3 \cdot Al_2O_2O_3$, or $2Y_2O_3 \cdot Al_2O_3$ is produced in the AlN sintered body. If CaO is used as an additive, a Ca-Al-O-based composite oxide such as $CaO-Al_2O_3$ or $2CaO-Al_2O_3$ is produced in the AlN sintered body. Such an aluminate remains as a grain boundary phase in a grain boundary triple point. In other words, an aluminum oxide impurity contained in the AlN powder is trapped by a grain boundary upon production of the aluminate, and the purity of AlN crystals is increased.

When the aluminate remains in the AlN sintered body, however, the thermal conductivity of the AlN sintered body is decreased in relation to the remaining amount. Therefore, sintering is performed in a reduction atmosphere for a long time period to remove the composite oxide from the system, thereby further increasing the purity, i.e., the thermal conductivity. An AlN sintered body not containing such a composite oxide is known to essentially consist of an AlN single phase by evaluation using X-ray diffractometry or an SEM. A mechanism of removable the composite oxide is assumed to have a relationship with a reduction-nitriding reaction and evaporation of the composite oxide. A speed at which the composite oxide transits outside the AlN sintered body depends on the sintering atmosphere and is higher in an atmosphere using a carbon sintering vessel than in an atmosphere using an AlN or BN sintering vessel. In this manner, known high-thermal conductivity AlN sintered bodies are roughly classified into an AlN sintered body consisting of an AlN single phase and an AlN sintered body in which an aluminate derived from an aluminum oxide impurity contained in an AlN powder as a raw material remains.

The AlN sintered body according to the present invention essentially consists of AlN crystal grains and 0.01 to 1.5 wt % (an element content in the case of a transition metal compound) of homogeneously dispersed transition metal particles and/or transition metal compound particles and therefore is a new product not containing an aluminate described above. Therefore, the AlN sintered body of the present invention has both a high thermal conductivity of 200 W/m·K or more obtained by a high purity of AlN and a light-shielding property obtained by the presence of the transition metal particles and/or transition metal compound particles. It is assumed that an AlN sintered body having the above arrangement has a light-shielding property for the following reason.

That is, when a predetermined amount of the transition metal particles and/or the transition metal compound particles are dispersed in AlN crystal grains, light absorption occurs on the surfaces of the transition metal particles and/or the transition metal compound particles. The reason for this is assumed that the dispersed particles are electrically conductive. An electrically conductive substance such as a metal almost reflects light and therefore exhibits so-called metallic luster even through its surface layer absorbs light. If fine particles are present, reflection and absorption are infinitely repeated at a portion of the fine particles. In addition, many metal particles are black as is well known. It is assumed, therefore, that in an AlN sintered body obtained by dispersing a predetermined amount of the transition metal particles and/or the transition metal compound particles in AlN crystal grains, a light-shielding property is obtained by light absorption and multiple reflection on the grain surfaces.

In addition, according to the present invention, a raw material powder consisting of a predetermined amount of an alkali earth compound powder and/or rare earth compound powder, a predetermined amount of transition metal particles and/or transition metal compound particles, and an aluminum nitride (AlN) powder as the balance is molded, and the molded body is sintered in a reduction gas atmosphere at 1,800° C. to 2,000° C. The sintering reaction progresses to increase the density and purity of the AlN powder regardless of the presence of the transition metal grains and/or transition metal compound grains. In other words, the transition metal particles and/or transition metal compound particles have almost no effect on the increase in density and purity of AlN in the above sintering process. As a result, an AlN sintered body in which the purity of AlN crystal grains is increased, and transition metal particles and/or transition metal compound particles are homogeneously dispersed in a grain boundary of the AlN crystal grains can be manufactured.

Although the AlN sintered body manufactured by the method as described above is determined to consist of AlN and a transition metal compound by evaluation using X-ray diffractometry or an SEM, it contains oxygen or another cation impurity at a level of several 100 ppm according to the results of elemental analysis. In addition, according to the results of calculation based on SEM photographs, while the AlN crystal grains grow to an average grain size of 5 to 20 μm during sintering, the transition metal compound substantially maintains its shape as a raw material and causes almost no grain growth. Therefore, an AlN sintered body having both a high thermal conductivity of 200 W/m·K or more and a light-shielding property obtained by the presence of the transition metal particles and/or transition metal compound particles in the grain boundary of the AlN crystal grains can be manufactured.

The present invention will be described in more detail below by way of its examples.

EXAMPLE 1

3 parts by weight (Y content; 2.38 parts by weight) of a $Y_2O_3$ powder having an average particle size of 0.1 μm and a purity of 99.9% and 0.5 parts by weight (Ti content; 0.30 parts by weight) of a $TiO_2$ particles having an average particle size of 1.0 μm and a purity of 99.9% were added to 96.5 parts by weight of an AlN powder having an impurity oxygen amount of 1.0 wt % and an average primary particle size of 0.6 μm, and the resultant material was mixed by a ball mill to prepare a raw material powder. Subsequently, 5 wt % of an acrylic binder were added to the raw material powder, the mixture was granulated, and 12 g of the granulated powder were molded at a uniaxial pressure of 500 kg/cm² to manufacture a 30 mm×30 mm×7mm compact.

Subsequently, the compact was heated up to 700° C. in a nitrogen gas atmosphere to remove the acryl-based binder. Thereafter, the resultant compact was set in a carbon vessel, and the vessel was put in a carbon heater furnace to perform sintering in a 1-atm nitrogen gas atmosphere at 1,850° C. for 48 hours, thereby manufacturing an AlN sintered body. A piece of the obtained AlN sintered body was milled, and its constituting phase was identified by X-ray diffractometry. As a result, as shown in Table 1 to be presented later, a constituting phase other than AlN was only an unknown phase assumed to be TiN.

COMPARATIVE EXAMPLE 1

A compact manufactured following the same procedures as in Example 1 was set in a carbon vessel, and the vessel was put in a carbon heater furnace to perform sintering in a 1-atm atmosphere at 1,850° C. for 2 hours, thereby manufacturing an AlN sintered body. A constituting phase of the obtained AlN sintered body was identified by X-ray diffractometry following the same procedures as in Example 1. As a result, as shown in Table 1 to be presented later, constituting phases other than AlN were TiN and yttrium aluminum compounds $YAlO_3$ and $Y_4Al_2O_9$.

COMPARATIVE EXAMPLE 7

An AlN sintered body was manufactured following the same procedures as in Example 1 except that a raw material powder was prepared by adding only 3 parts by weight (Y content; 2.38 parts by weigh) of a $Y_2O_3$ powder to 97 parts by weight of an AlN powder similar to that used in Example 1 and mixing the resultant material by a ball mill. A constituting phase of the obtained AlN sintered body was identified by X-ray diffractometry following the same procedures as in Example 1. As a result, as shown in Table 1 to be presented later, no constituting phase other than AlN was found.

COMPARATIVE EXAMPLE 3

An AlN sintered body was manufactured following the same procedures as in Example 1 except that a raw material powder was prepared by adding only 3 parts by weight (Y content; 2.38 parts by weight) of a $Y_2O_3$ powder to 97 parts by weight of an AlN powder similar to that used in Example 1 and mixing the resultant material by a ball mill and sintering was performed for 2 hours. A constituting phase of the obtained AlN sintered body was identified by X-ray diffractometry following the same procedures as in Example 1. As a result, as shown in Table 1 to be presented later, constituting phases other than AlN were yttrium aluminum compounds $YAlO_3$ and $Y_4Al_2O_9$.

A color tone of each of the AlN sintered bodies of Example 1 and Comparative Examples 1 to 3 was checked. In addition, a density and a thermal conductivity of each of the AlN sintered bodies of Example 1 and Comparative Examples 1 to 3 were measured by the following methods. These results are also shown in Table 1 to be presented later.

(1) Density measurement of AlN sintered body

The density of each AlN sintered body was measured by an Archimedes method.

(2) Thermal conductivity measurement of AlN sintered body

A disc having a diameter of 10 mm and a thickness of 3 mm was cut out from each AlN sintered body, and a thermal conductivity was measured at a temperature of 21° C.±2° C. by a laser flash method.

FIGS. 1 to 4 show SEM photographs of sections of the AlN sintered bodies obtained by Example 1 and Comparative Examples 1 to 4, respectively. FIGS. 5 to 8 show diffuse transmittance of the AlN sintered bodies of Example 1 and Comparative Examples 1 to 3, respectively, with respect to light having a specific wavelength range.

Figure 5:
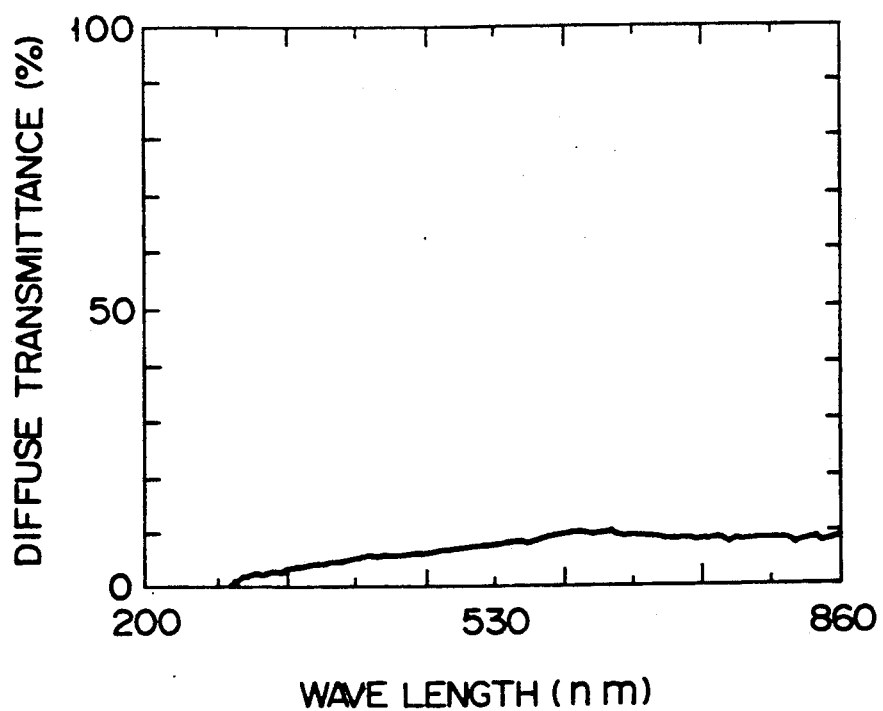
FIGS. 5 to 8 are graphs showing diffuse transmittance of the AlN sintered bodies manufactured by Example 1 and Comparative Examples 1 to 3, respectively, with respect to light having a specific wavelength range.

As is apparent from Table 1 to be presented later and the diffuse transmittance shown in FIG. 5, the AlN sintered body of Example 1 has both a high thermal conductivity and a good light-shielding property. The AlN sintered body of Example 1 has excellent characteristics because it is constituted by only AlN crystal grains and a phase homogeneously distributed near a grain boundary of the grains and assumed to be TiN as is understood from the constituting phase shown in Table 1 and the SEM photograph shown in FIG. 1.

Figure 6:
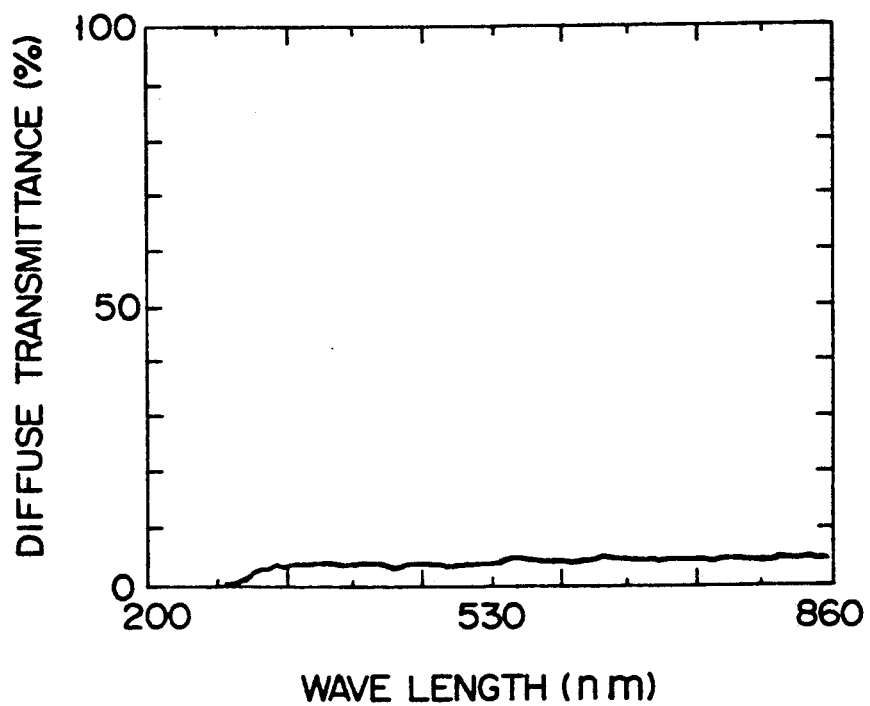

As is apparent from Table 1 to be presented later and the diffuse transmittance shown in FIG. 6, however, although the AlN sintered body of Comparative Example 1 has a good light-shielding property, its thermal conductivity is low. The thermal conductivity of the AlN sintered body of Comparative Example 1 is low because the AlN grains have but an insufficient impurity concentration, and also because yttrium aluminum oxide is present in addition to TiN near a grain boundary of AlN crystal grains as is understood from the constituting phase shown in Table 1 and the SEM photograph shown in FIG. 2.

Figure 7:
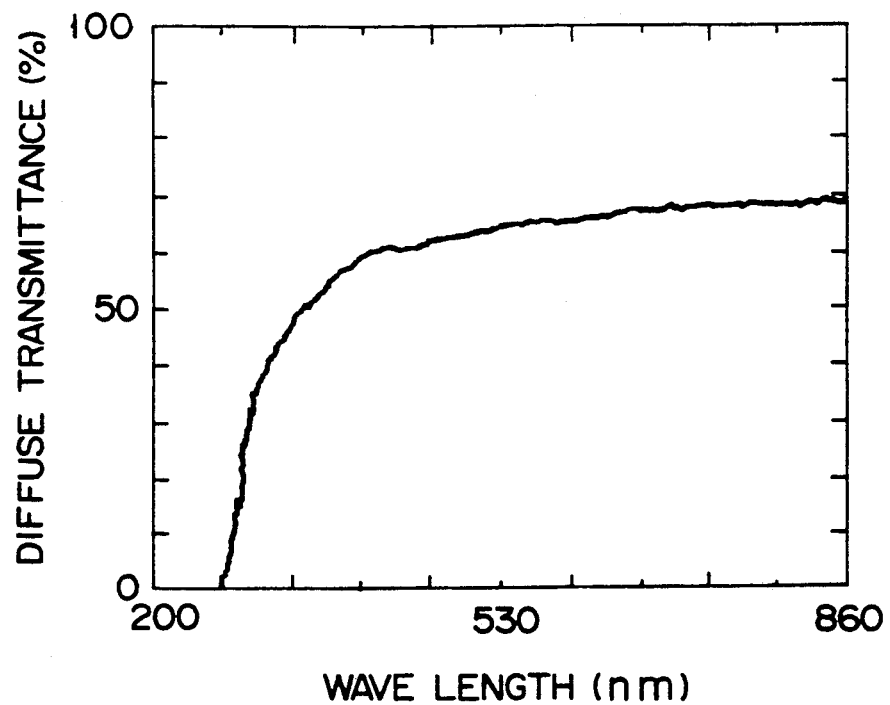

As is apparent from Table 1 to be presented later and the diffuse transmittance shown in FIG. 7, although the AlN sintered body of Comparative Example 2 has a high thermal conductivity, it has transparency. The AlN sintered body of Comparative Example 2 has transparency because no constituting phase other than the AlN crystal grains is contained and a purity is increased as is understood from the constituting phase shown in Table 1 and the SEM photograph shown in FIG. 3.

Figure 8:
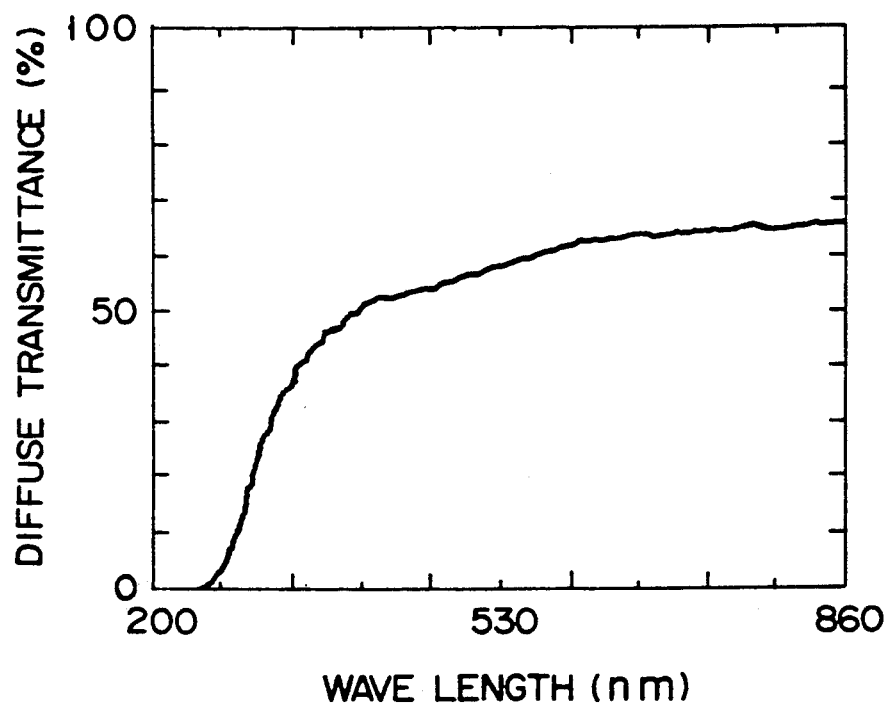

As is apparent from Table 1 to be presented later and the diffuse transmittance shown in FIG. 8, the AlN sintered body of Comparative Example 3 has not only a low thermal conductivity but also transparency. The AlN sintered body of Comparative Example 3 has a low thermal conductivity and transparency because the AlN grains have but an insufficient impurity concentration, and also because a large amount of yttrium aluminum oxide is present near a grain boundary of AlN crystal grains as is understood from the constituting phase shown in Table 1 and the SEM photograph shown in FIG. 4.

EXAMPLES 2-8

Seven types of AlN sintered bodies were manufactured following the same procedures a in Example 1 except that raw material powders shown in Table 2 to be presented later were used.

A color tone of each of the AlN sintered bodies of Examples 2 to 8 was checked. As a result, each AlN sintered body had a dark brown or gray color to exhibit a satisfactory light-shielding property. When these AlN sintered bodies were subjected to X-ray diffractometry, Examples 2, 3, 4, and 5 to 8 contained, in addition to AlN, phases assumed to be ZrN, NbC, TaC, and TiN, respectively. In addition, a density and a thermal conductivity of each AlN sintered body were measured following the same procedures as in Example 1, and an electrical resistance, an insulation breakdown voltage, and a permittivity of these sintered bodies were measured by the following methods. The measurement results are shown in Table 2 to be presented later.

(1) Measurement of electrical resistance of AlN sintered body

An electrical resistance was measured by applying a DC voltage of 100 V on the AlN sintered body at room temperature in accordance with a two-terminal method.

(2) Measurement of insulation breakdown voltage of Al sintered body

An insulation breakdown voltage was measured by applying a 50-Hz AC voltage on the AlN sintered body in an insulating oil at room temperature at a boosting rate of 500 V/sec.

(3) Measurement of permittered of AlN sintered body

Permittivity of the AlN sintered body was measured at room temperature and a frequency 10 GHz in accordance with a cavity resonance method.

EXAMPLES 9-14

Six types of AlN sintered bodies were manufactured following the same procedures as in Example 1 except that raw material powders shown in Table 3 to be presented later were used.

A color tone of each of the AlN sintered bodies of Examples 9 to 14 was checked. As a result, each AlN sintered body had a dark brown or gray color to exhibit a satisfactory light-shielding property. When these AlN sintered bodies were subjected to X-ray diffractometry, Examples 9, 10, 11, 12, 13, and 14 contained, in addition to AlN, unknown phases assumed to be ZrN, NbC, TaC, TiN, metal W, and metal Mo, respectively. In addition, a density, a thermal conductivity, an electrical resistance, an insulation breakdown voltage, and a permittivity of each AlN sintered body were measured by the methods described above. The measurement results are shown in Table 3 to be presented later.

EXAMPLES 15 to 19

Five types of AlN sintered bodies were manufactured following the same procedures as in Example 1 except that raw material powders having a component composition as in Example 1 were prepared by using AlN powders having compositions as shown in Table 4 to be presented later and sintering was performed under the conditions shown in Table 4. Note that 6 g of a granulated powder were used in Example 19.

A color tone of each of the AlN sintered bodies of Examples 15 to 19 was checked. As a result, each AlN sintered body had a dark brown or gray color to exhibit a satisfactory light-shielding property. When these AlN sintered bodies were subjected to X-ray diffractometry, all of the AlN sintered bodies contained an unknown phase assumed to be TiN in addition to AlN. In addition, a density, a thermal conductivity, an electrical resistance, an insulation breakdown voltage, and a permittivity of each AlN sintered body were measured by the methods described above. The measurement results are shown in Table 4 to be presented later.

EXAMPLE 20

A composition prepared by adding an acryl-based binder to a raw material powder similar to that used in Example 1 was formed into a sheet by a doctor blade method and cut into 1,000 sheets each having a size of 6.2 mm × 6.2 mm × 0.77 mm. Subsequently, these sheets were subjected to binder removal and sintering following the same procedures as in Example 1 to manufacture sheet-like AlN sintered bodies.

COMPARATIVE EXAMPLE 4

A raw material powder was prepared by adding only 3 parts by weight (Y content; 2.38 parts by weight) of a $Y_2O_3$ powder to 97 parts by weight of an AlN powder similar to that used in Example 1 and mixing the resultant material by a ball mill, and a composition was obtained by adding an acryl-based binder to the material powder. The obtained composition was formed into a sheet by a doctor blade method and cut into 1,000 sheets each having a size of 6.2 mm × 6.2 mm × 0.77 mm. Subsequently, these sheets were subjected to binder removal and sintering following the same procedures as in Example 1 to manufacture sheet-like AlN sintered bodies.

The presence/absence of a color variation was checked with a naked eye and by using a microscope for each of the sheet-like AlN sintered bodies of Example 20 and Comparative Example 4. As a result, while a color variation was found in 270 out of 1,000 sheets in Comparative Example 4, it was found in only three out of 1,000 sheets in Example 20.

As has been described above, according to the present invention, there is provided an AlN sintered body which has both a high thermal conductivity of 200 W/m·K or more and a good light-shielding property and therefore can be suitably used as a substrate of a circuit board and a method of simply manufacturing such an AlN sintered body at a high yield.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

TABLE 1

| | Color tone | Constituting phase other than AlN | Density (g/cm³) | Thermal Conductivity (W/m · K) |
|---|---|---|---|---|
| Example 1 | Dark brown | Unknown phase (assumed to be TiN) | 3.27 | 225 |
| Comparative Example 1 | Dark brown | $YAlO_3$, $Y_4Al_2O_9$, TiN | 3.30 | 180 |
| Comparative Example 2 | Light orangy while (Transparent) | None | 3.26 | 260 |
| Comparative Example 3 | Light orangy white (Transparent) | $YAlO_3$, $Y_4Al_2O_9$ | 3.30 | 182 |

TABLE 2

| Raw material powder composition | | | |
|---|---|---|---|
| AlN powder | | Additive | |
| Impurity oxygen amount (wt %) | Average particle size (μm) | Component | Addition amount; element content in parenthese* |

TABLE 2-continued

| | | | | |
|---|---|---|---|---|
| Example 2 | 1.0 | 0.6 | $Y_2O_3$<br>$ZrO_2$ | 3.0 (Y: 2.38)<br>0.5 (Zr: 0.37) |
| Example 3 | 1.0 | 0.6 | $Y_2O_3$<br>$Nb_2O_5$ | 3.0 (Y: 2.38)<br>0.5 (Nb: 0.35) |
| Example 4 | 1.0 | 0.6 | $Y_2O_3$<br>$Ta_2O_5$ | 3.0 (Y: 2.38)<br>0.5 (Ta: 0.41) |
| Example 5 | 1.0 | 0.6 | $Y_2O_3$<br>$TiO_2$ | 3.0 (Y: 2.38)<br>0.05 (Ti: 0.03) |
| Example 6 | 1.0 | 0.6 | $Y_2O_3$<br>$TiO_2$ | 3.0 (Y: 2.38)<br>1.5 (Ti: 0.91) |
| Example 7 | 1.0 | 0.6 | $Y_2O_3$<br>$TiO_2$ | 1.0 (Y: 0.79)<br>0.5 (Ti: 0.30) |
| Example 8 | 1.0 | 0.6 | $Y_2O_3$<br>$TiO_2$ | 10.0 (Y: 7.78)<br>0.5 (Ti: 0.31) |

| | Density ($g/cm^2$) | Thermal conductivity ($W/m \cdot K$) | Electrical resistance ($\Omega cm$) | Insulation breakdown voltage (KV/mm) at 50 Hz | Permittivity at 1 MHz |
|---|---|---|---|---|---|
| Example 2 | 3.27 | 252 | $>10^{14}$ | 18 | 8.5 |
| Example 3 | 3.27 | 255 | $>10^{14}$ | 16 | 8.6 |
| Example 4 | 3.27 | 256 | $>10^{14}$ | 19 | 8.7 |
| Example 5 | 3.26 | 263 | $>10^{14}$ | 18 | 8.4 |
| Example 6 | 3.28 | 238 | $>10^{14}$ | 16 | 8.8 |
| Example 7 | 3.27 | 230 | $>10^{14}$ | 17 | 8.8 |
| Example 8 | 3.28 | 234 | $>10^{14}$ | 16 | 8.7 |

Addition amount and element content are represented by parts by weight

TABLE 3

| | Raw material powder composition | | | |
|---|---|---|---|---|
| | AlN powder | | Additive | |
| | Impurity oxygen amount (wt %) | Average particle size (μm) | powder | Addition amount; element content in parenthese* |
| Example 9 | 1.0 | 0.6 | $Y_2O_3$<br>ZrN | 3.0 (Y: 2.38)<br>0.3 (Zr: 0.26) |
| Example 10 | 1.0 | 0.6 | $Y_2O_3$<br>NbN | 3.0 (Y: 2.38)<br>0.3 (Nb: 0.26) |
| Example 11 | 1.0 | 0.6 | $Y_2O_3$<br>TaN | 3.0 (Y: 2.38)<br>0.3 (Ta: 0.27) |
| Example 12 | 1.0 | 0.6 | $Y_2O_3$<br>TiN | 3.0 (Y: 2.38)<br>0.3 (Ti: 0.23) |
| Example 13 | 1.0 | 0.6 | $Y_2O_3$<br>W | 3.0 (Y: 2.38)<br>0.3 |
| Example 14 | 1.0 | 0.6 | $Y_2O_3$<br>Mo | 3.0 (Y: 2.38)<br>0.3 |

| | Density ($g/cm^2$) | Thermal conductivity ($W/m \cdot K$) | Electrical resistance ($\Omega cm$) | Insulation breakdown voltage (KV/mm) at 50 Hz | Permittivity at 1 MHz |
|---|---|---|---|---|---|
| Example 9 | 3.26 | 255 | $>10^{14}$ | 18 | 8.6 |
| Example 10 | 3.26 | 253 | $>10^{14}$ | 17 | 8.6 |
| Example 11 | 3.26 | 256 | $>10^{14}$ | 18 | 8.6 |
| Example 12 | 3.26 | 257 | $>10^{14}$ | 18 | 8.6 |
| Example 13 | 3.26 | 258 | $>10^{14}$ | 16 | 8.7 |
| Example 14 | 3.26 | 251 | $>10^{14}$ | 18 | 8.7 |

Addition amount and element content are represented by parts by weight

TABLE 4

| | AlN powder | | | | | | | | |
|---|---|---|---|---|---|---|---|---|---|
| | Impurity oxygen amount (wt %) | Average particles size (μm) | Temperature (C.°) | Time (hr) | Density (g/cm³) | Thermal conductivity (W/m·K) | Electrical resistance (Ωcm) | Insulation breakdown voltage (kV/mm) at 50 Hz | Permittivity at 1 MHz |
| Example 15 | 0.2 | 1.1 | 1850 | 48 | 3.26 | 245 | $>10^{14}$ | 20 | 8.6 |
| Example 16 | 3.1 | 0.4 | 1850 | 48 | 3.26 | 238 | $>10^{14}$ | 19 | 8.6 |
| Example 17 | 1.0 | 0.6 | 1800 | 96 | 3.26 | 252 | $>10^{14}$ | 18 | 8.7 |
| Example 18 | 1.0 | 0.6 | 1950 | 48 | 3.26 | 250 | $>10^{14}$ | 18 | 8.6 |
| Example 19 | 1.0 | 0.6 | 1850 | 6 | 3.26 | 248 | $>10^{14}$ | 19 | 8.7 |

What is claimed is:

1. A light-shielding aluminum nitride sintered body consisting essentially of aluminum nitride sintered crystal grains and 0.01 to 1.5 wt. % in terms of metal of transition metal particles and/or transition metal compound particles homogeneously dispersed in said aluminum nitride sintered crystal grains, and having a thermal conductivity of not less than 200 W/m·K.

2. A method of manufacturing a light-shielding aluminum nitride sintered body consisting essentially of aluminum nitride sintered crystal grains and 0.01 to 1.5 wt. % in terms of metal of transition metal particles and/or transition metal compound particles homogeneously dispersed in said aluminum nitride sintered crystal grains, and having a thermal conductivity of not less than 200 W/m·K, comprising the steps of:

molding a raw material powder consisting of not more than 30 wt. % in terms of alkaline earth or rare earth element of an alkaline earth compound powder and/or rare earth compound powder and 0.01 to 1.5 wt. % in terms of metal of transition metal particles and/or transition metal compound particles, the balance of said raw material powder consisting of an aluminum nitride powder; and sintering said molded body in a reduction gas atmosphere consisting of a gas mixture of carbon gas and an inert gas at 1,800° C. to 2,000° C.

3. The sintered body according to claim 1, wherein the average particles size of said transition metal particles and/or transition metal compound particles is not more than 4 μm.

4. The sintered body according to claim 1, wherein said transition metal compound is a conductor.

5. The sintered body according to claim 4, wherein said transition metal compound conductor is a nitride or a carbide of a metal selected from the group consisting of Zr, Nb, Ta, and Ti.

6. The method according to claim 2, wherein said aluminum nitride powder contains 0.1 to 2.5 wt % of impurity oxygen.

7. The method according to claim 2, wherein the average particle size of said aluminum nitride powder is not more than 1.5 μm.

8. The method according to claim 2, wherein said alkaline earth compound is an oxide, a carbide, a fluoride, a carbonate, an oxalate, a nitrate, or an alkoxide of Ca, Ba, and Sr.

9. The method according to claim 2, wherein said rare earth compound is an oxide, a carbide, a fluoride, a carbonate, an oxalate, a nitrate, or an alkoxide of a metal selected from the group consisting of Y, La, Ce, Nd, Dy, and Pr.

10. The method according to claim 2, wherein said transition metal compound is an oxide, a nitride, a carbide, a fluoride, a carbonate, an oxalate, a nitrate, or an alkoxide of a transition metal.

* * * * *